United States Patent [19]
Chadha

[11] Patent Number: 5,641,416
[45] Date of Patent: Jun. 24, 1997

[54] METHOD FOR PARTICULATE-FREE ENERGY BEAM CUTTING OF A WAFER OF DIE ASSEMBLIES

[75] Inventor: Surjit S. Chadha, Meridian, Id.

[73] Assignee: Micron Display Technology, Inc., Boise, Id.

[21] Appl. No.: 548,019

[22] Filed: Oct. 25, 1995

[51] Int. Cl.$^6$ .................................................. B23K 26/08
[52] U.S. Cl. ........................ 219/121.69; 438/20; 438/463
[58] Field of Search ........................ 219/121.69, 121.72, 219/121.68; 437/173, 226, 227

[56] References Cited

U.S. PATENT DOCUMENTS

| | | | |
|---|---|---|---|
| 3,629,545 | 12/1971 | Graham | 219/121.72 |
| 3,970,819 | 7/1976 | Gates et al. | 219/121.69 |
| 3,991,296 | 11/1976 | Kojima et al. | 219/121.68 |
| 4,046,985 | 9/1977 | Gates | 219/121.68 |
| 4,224,101 | 9/1980 | Tijburg et al. | 219/121.69 |
| 4,543,464 | 9/1985 | Takeuchi | 219/121.68 |
| 5,151,135 | 9/1992 | Magee et al. | 437/173 |

FOREIGN PATENT DOCUMENTS

| | | |
|---|---|---|
| 3-276662 | 12/1991 | Japan . |
| 4-118190 | 4/1992 | Japan . |

*Primary Examiner*—Geoffrey S. Evans
*Attorney, Agent, or Firm*—Seed and Berry LLP

[57] ABSTRACT

A process for separating FED baseplates or other types of die assemblies from one another without producing any particulate matter or slag that could damage some of the baseplates. In one embodiment a high energy beam is aligned with a cutting line on the wafer that defines a path between the die assemblies along which the wafer is to be cut. At least one of the high energy beam or the wafer is moved in the direction of the cutting line so that the high energy beam passes over the wafer and penetrates the wafer to an intermediate depth along the length of the cutting line. The moving step is then repeated after each pass of the high energy beam over the wafer until the wafer is severed along the cutting path.

7 Claims, 6 Drawing Sheets

METHOD FOR PARTICULATE-FREE ENERGY BEAM CUTTING OF A WAFER OF DIE ASSEMBLIES

This invention was made with Government support under Contract No. DABT63-93-C-0025 awarded by Advanced Research Project Agency (ARPA). The Government has certain rights in this invention.

TECHNICAL FIELD

The present invention relates to cutting a wafer to separate die assemblies from one another, and more particularly to a method for cutting a wafer without producing any particulate matter or slag.

BACKGROUND OF THE INVENTION

Field emission displays (FEDs) are a type of die assembly used in connection with computers, television sets, camcorder viewfinders, and other electronic devices requiring flat panel displays. FEDs have a baseplate and a faceplate positioned opposite to one another across a narrow vacuum gap. In large FEDs, a number of spacers are positioned between the baseplate and the faceplate to prevent atmospheric pressure from collapsing the plates together. The baseplate typically has a base substrate upon which a number of sharp, cone-shaped emitters are formed, an insulator layer positioned on the substrate having cavities through which the emitters extend, and an extraction grid formed on the insulator layer around the cavities. The faceplate has a substantially transparent substrate, a transparent conductive layer disposed on the inner surface of the transparent substrate, and a cathodoluminescent material deposited on the transparent conductive layer. In operation, a potential is established across the extraction grid and the emitter tips to extricate electrons from the emitter tips. The electrons pass through the cavities in the insulator layer and the holes in the extraction grid, and impinge upon the cathodoluminescent material in a desired pattern.

Typically, many FED baseplates are fabricated on a single wafer. The baseplates are separated from one another by cutting the wafer in the spaces between the individual baseplates. Wafers are conventionally cut by a thin abrasive wheel that saws through the wafer much like a circular saw cuts wood, or by a laser scribe that scribes a kerf in the wafer which is then broken along the kerf. Abrasive wheels are generally a metal blade embedded with very small diamonds, and thus they produce a significant amount of particulate matter as they cut the wafer. Abrasive wheels cut the wafers at a rate of 1.0 to 1.5 inches per second. Laser scribing also produces some particulate matter because small particles break off of the wafer when it is broken.

Most microelectronic devices are sensitive to particulate matter. FED baseplates are particularly sensitive to particulate matter because they may be ruined by only a few particles. A single particle can obstruct or short out several thousand emitters and thus prevent several pixels of a display from illuminating. Since the human eye can notice when a single pixel on a display does not illuminate, a single particle on a baseplate can effectively ruin an entire FED. On the other hand, memory devices are not ruined by a few particles because each particle will only affect a small percentage of the available memory which will not be noticed in operation. Accordingly, compared to many other types of microelectronic devices, it is even more important to protect FED baseplates from the particulate matter produced by conventional cutting techniques.

FED baseplates are conventionally protected by depositing a 2-3 μm thick layer of organic protective material over the baseplates before cutting the wafer, and then attaching a thin plastic film to the surface of the organic protective layer. The organic protective layer and plastic film form a barrier that prevents any particulate matter from contacting the features on the baseplates. After the wafer is cut, the plastic film is removed from the organic protective material, and the organic protective material is washed from the baseplates.

One problem with conventional cutting techniques is that the process of protecting FED baseplates from particulate matter increases the production time and cost of manufacturing baseplates. Because the conventional baseplate protection process described above does not add any permanent structural features to the baseplates, the additional materials and process steps are, in effect, useless after the baseplates are finished. Therefore, it would be desirable to minimize the time and cost of protecting the baseplates from particulate matter produced by conventional cutting techniques.

Another problem of conventional cutting techniques is that the removal of the organic protective material itself can damage the emitters or the extraction grid on the baseplate. Still another problem of conventional cutting techniques is that the abrasive wheels create small cracks in the wafer that can grow when the wafer is heated. Accordingly, it would also be desirable to develop a method for cutting a wafer that minimizes the losses associated with protecting the baseplates with an organic protective material, and reduces cracks in the wafer.

One desirable technique for cutting wafers is to completely cut them with a laser. Lasers do not produce any particulate matter because they burn through the silicon and form areas of melted silicon, or slag, around the periphery of the cut pieces. To date, however, completely cutting through an FED baseplate with a laser has not been commercially feasible because the slag may cover the emitters or the contact points and, thus, prevent the baseplate from operating. Therefore, it would be desirable to develop a method to cut a wafer of FED baseplates with a laser that does not produce any measurable slag.

SUMMARY OF THE INVENTION

The inventive method provides a process for separating FED baseplates or other types of dies from one another without producing any particulate matter or slag that could damage some of the baseplates. In one embodiment of the invention, a high energy beam is aligned with a cutting line on the wafer that defines a path between the baseplates along which the wafer is to be cut. Either the high energy beam or the wafer is moved in the direction of the cutting line so that the high energy beam passes over the wafer and penetrates the wafer to an intermediate depth along the length of the cutting line. The moving step is then repeated after each pass of the high energy beam over the wafer until the wafer is severed along the cutting line.

DETAILED DESCRIPTION OF THE INVENTION

The invention is a process for particle-free cutting of a wafer to sever FED baseplates or other types of die assemblies from one another. Unlike conventional cutting techniques that use an abrasive wheel or a laser scribe, the present invention cuts the wafer with a high energy beam that does not produce any particulate matter. Moreover, unlike conventional laser cutting techniques, the method of the invention does not produce slag around the perimeter of the cut baseplates. A central aspect of the method of the present invention is that the wafers are cut without producing particulate matter or slag.

Figure 1:
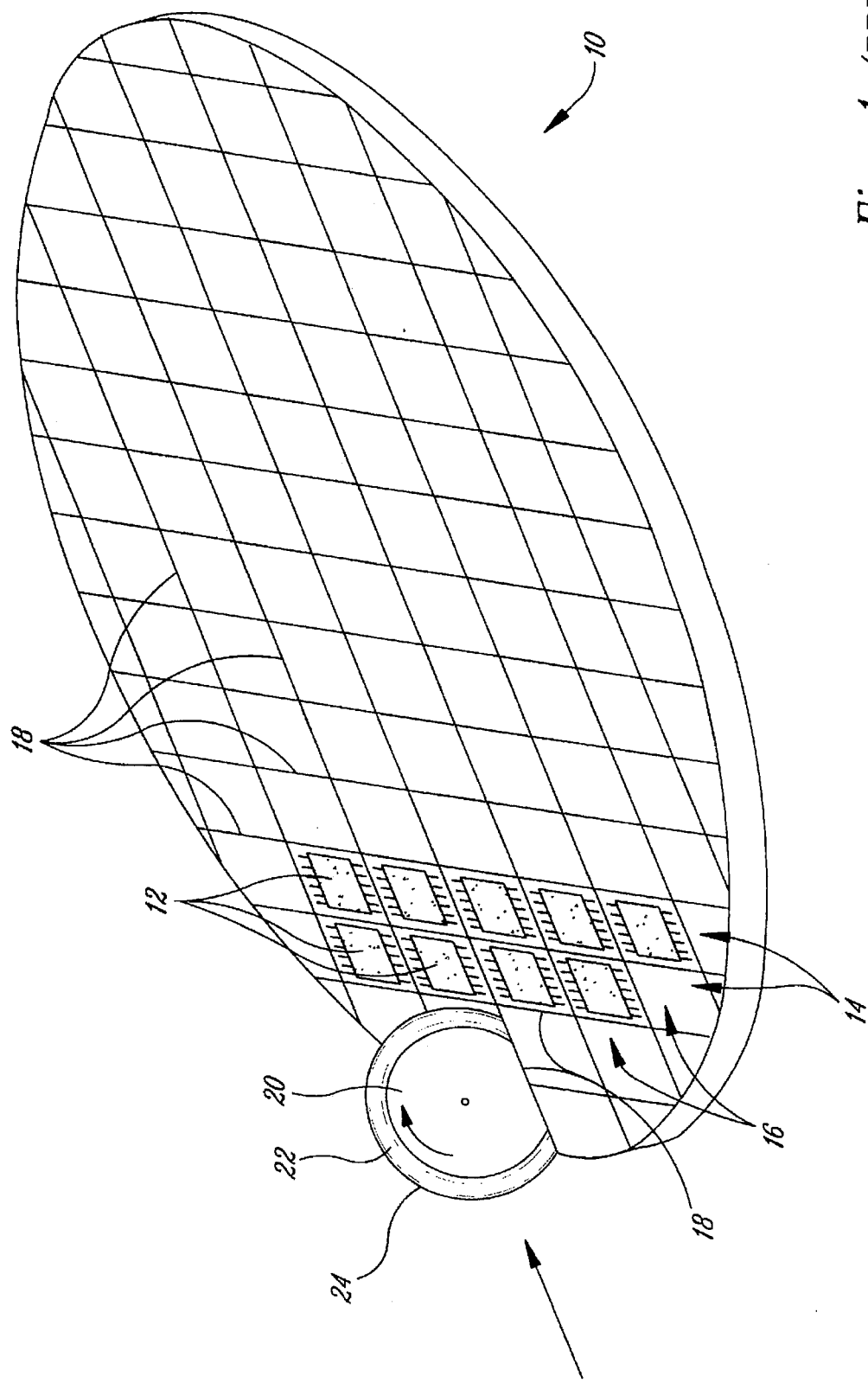
FIG. 1 is an isometric view of a conventional abrasive wheel cutting a wafer in accordance with the prior art.
Figure 2:
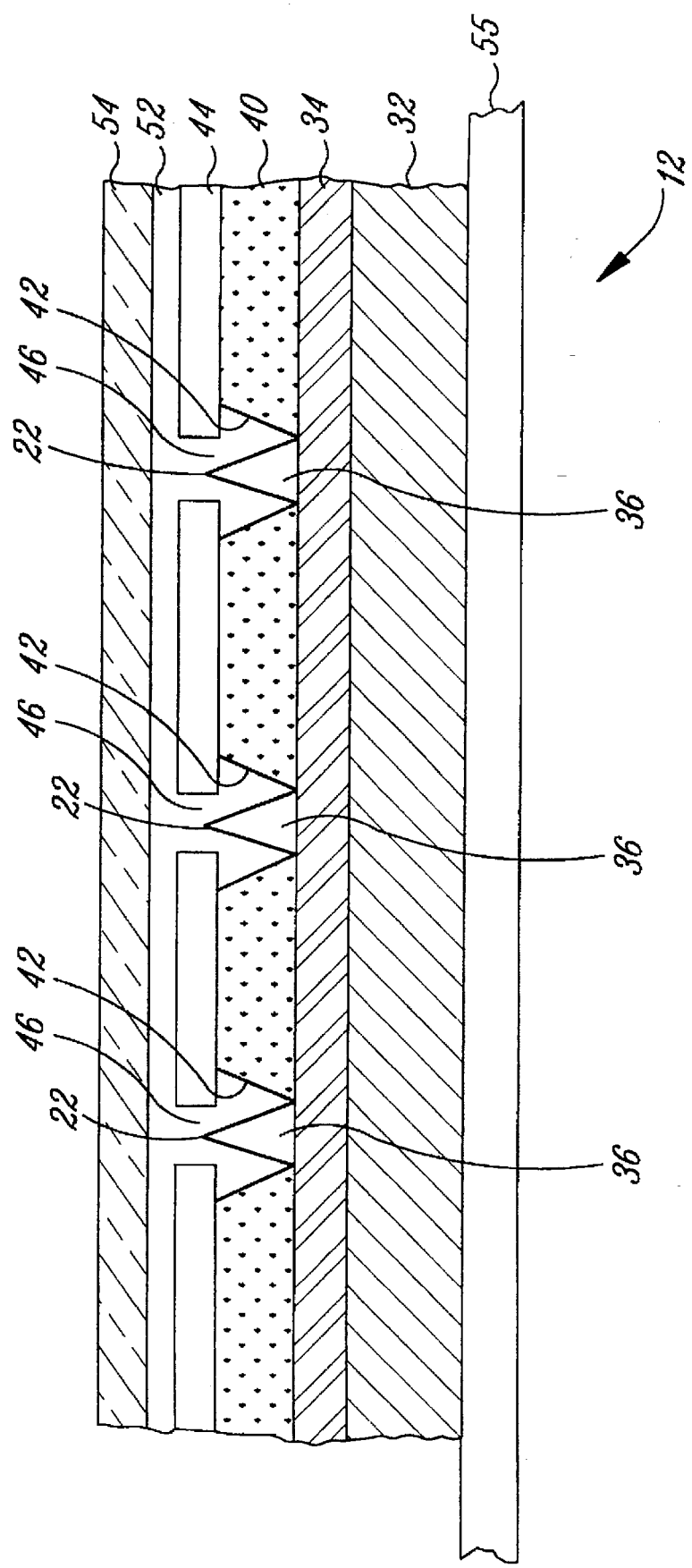
FIG. 2 is a cross-sectional view of an FED baseplate that is covered with an organic protective material and a protective plastic film in accordance with the prior art.
Figure 3:
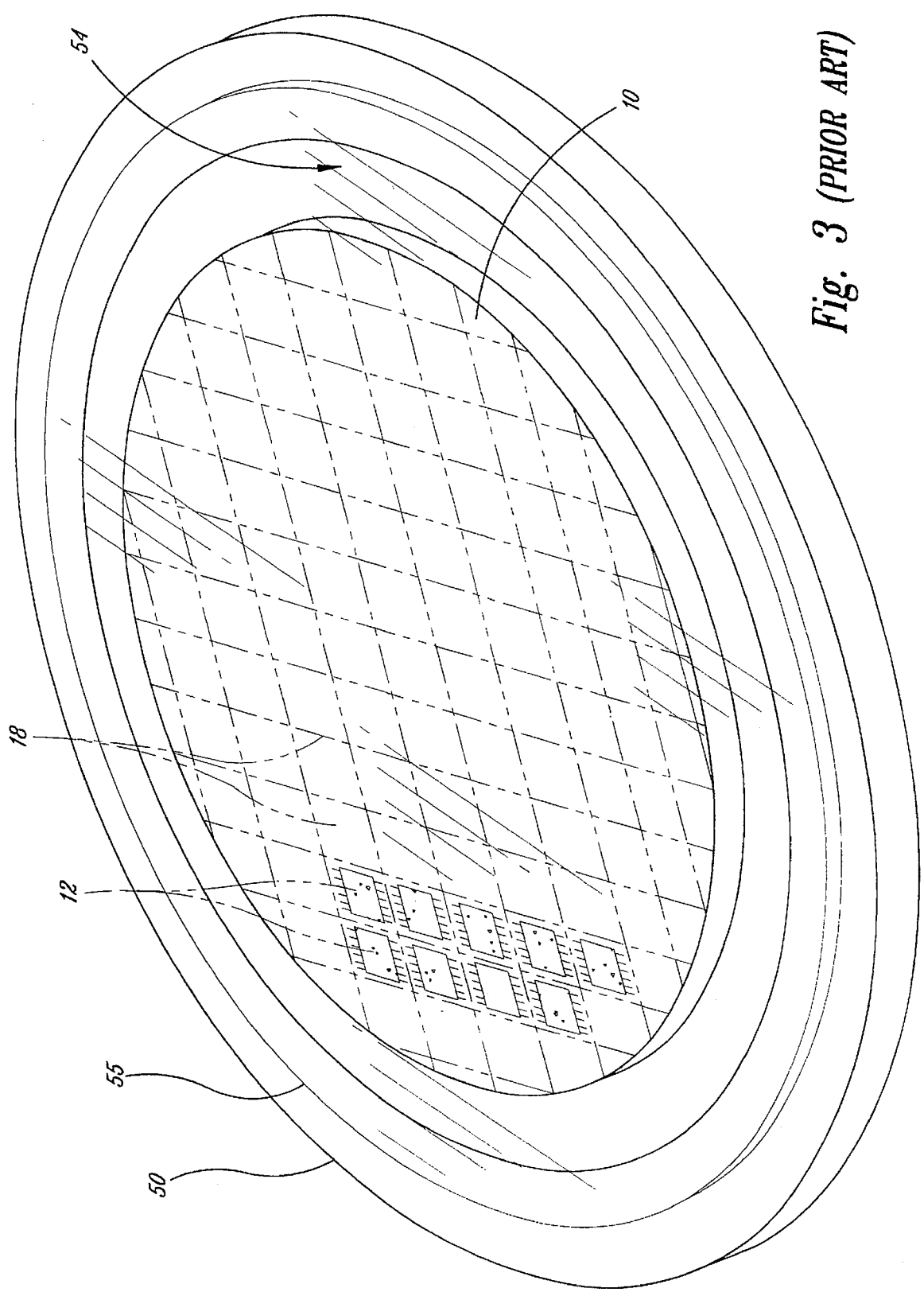
FIG. 3 is an isometric view of the protective organic layer and the plastic film of FIG. 2.
Figure 4:
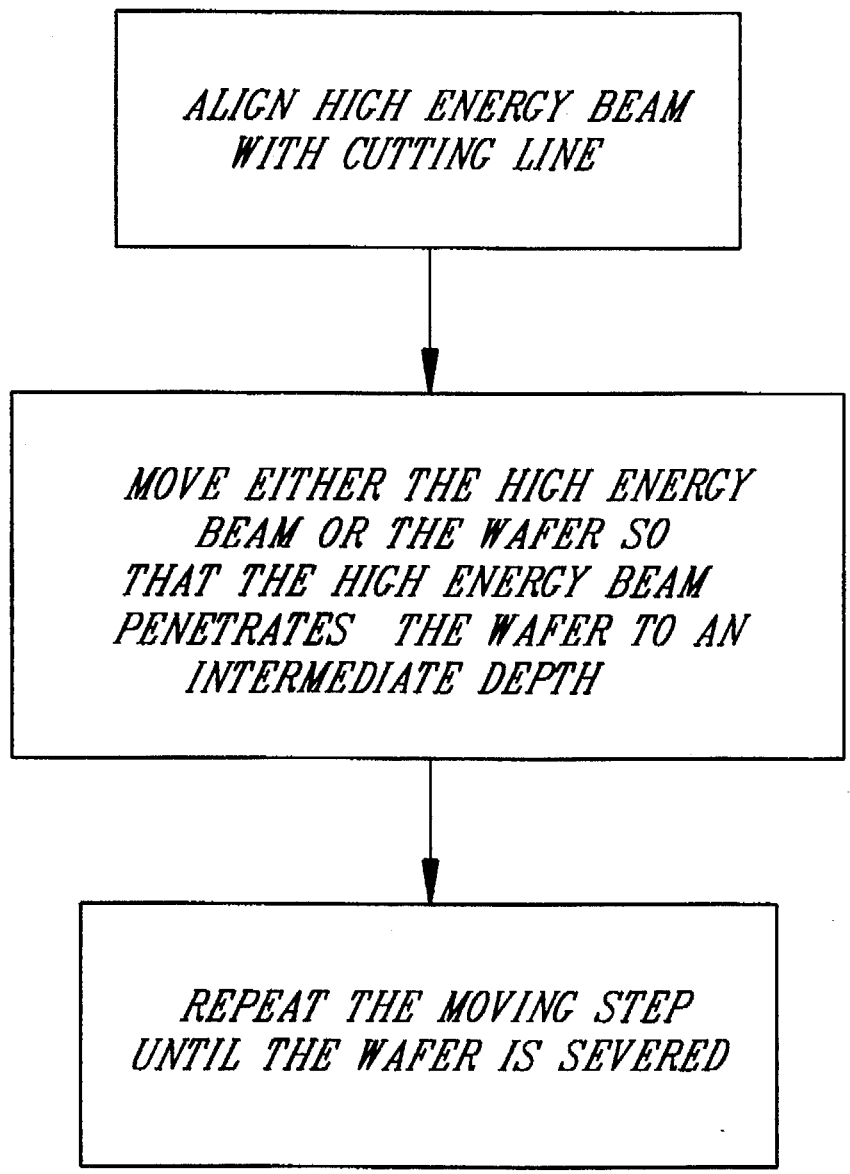
FIG. 4 is a schematic illustration of one method of cutting a wafer in accordance with the invention.
Figure 5:
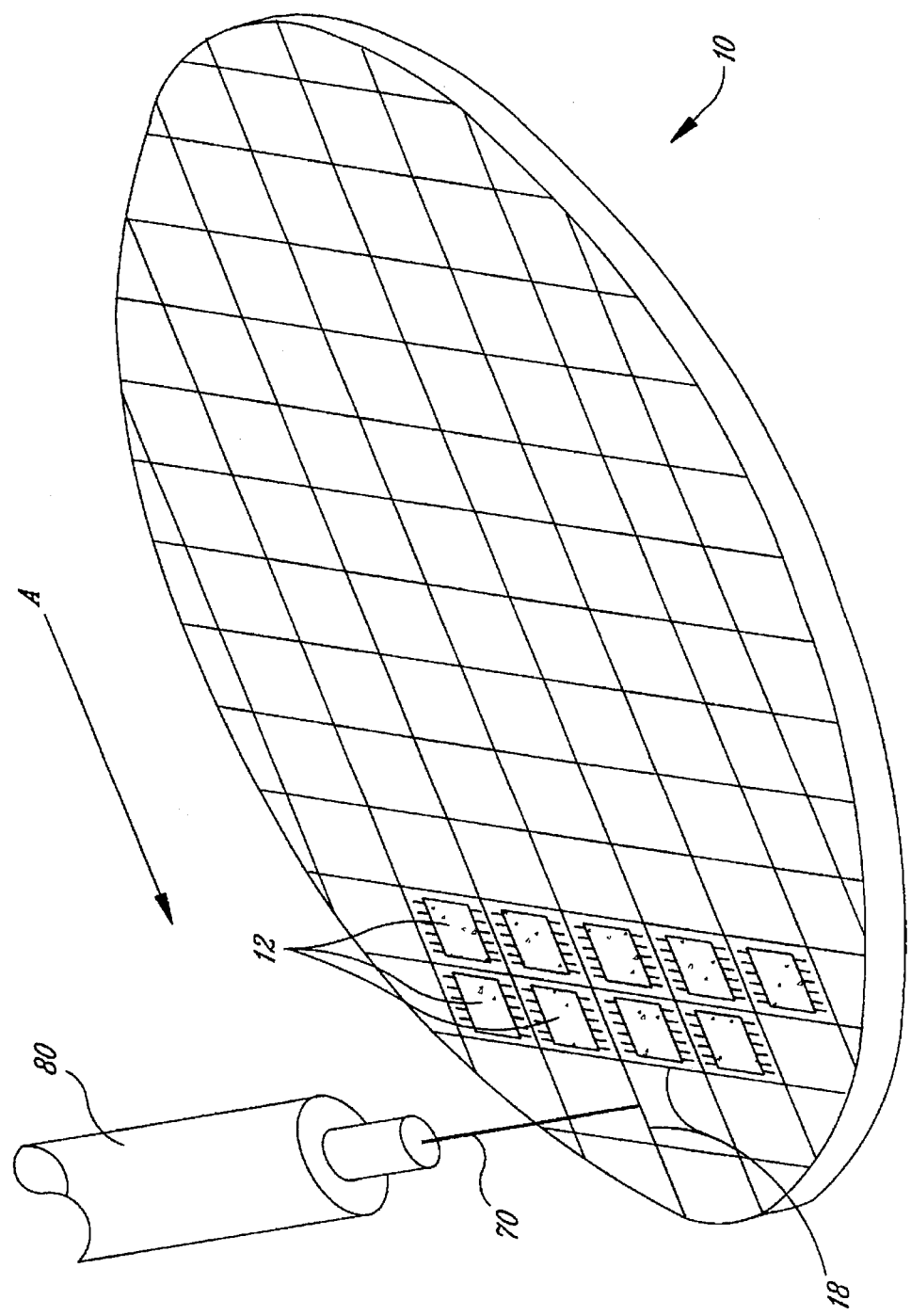
FIG. 5 is an isometric view of a wafer being cut in accordance with the invention.

FIGS. 1-3 illustrate an abrasive wheel cutting a wafer, and a process for protecting the baseplates from the particulate matter produced by the abrasive wheel. FIGS. 4-6 illustrate the method of the invention. Like reference numbers refer to like parts throughout the various figures.

FIG. 1 illustrates a wafer 10 with a plurality of dies or baseplates 12 fabricated on the wafer. Generally, the wafer 10 is a thin slice of single-crystal silicon that is used as the basic substrate for fabricating the integrated circuits and emitters of the baseplates. The diameter of the wafer 10 is commonly between 6 to 8 inches, and hundreds of baseplates 12 are typically fabricated on a single wafer 10. The baseplates 12 are arranged in rows 14 and columns 16, and a number of cutting lines 18 are positioned between each of the rows and columns. The cutting lines 18 define the preferred paths for cutting the wafer 10 to sever the baseplates 12 from one another. As described above in the Background of the Invention section, conventional cutting techniques cut the wafer 10 along the cutting lines 18 with an abrasive wheel 20 that has a diamond-embedded cutting edge 22, or a laser scribe (not shown). The abrasive wheel 20 physically removes the material of the wafer 10 along the cutting lines 18 as the diamonds abrade the wafer and rub off small particles of material. Thus, the abrasive wheel 20 produces a significant amount of particulate matter 24 as it cuts the wafer 10.

The particulate matter 24 produced by the abrasive wheel 20 will damage the baseplates 12, unless the baseplates are protected so that the particulate matter cannot contact their finished surfaces. Referring to FIG. 2, an FED baseplate 12 is illustrated in more detail to show how baseplates are protected by an organic layer and plastic film in accordance with the prior art. The baseplate 12 has a supporting substrate 32 upon which a column line or a row line of conductive material 34 is deposited. A number of emitters 36 are constructed on top of the conductive material 34. An insulator layer 40 is deposited on top of the conductive material 34, and an extraction grid 44 is formed on top of the insulator layer 40. A number of cavity openings 46 are formed in the extraction grid 44 by a chemical mechanical planarization process such that each cavity opening 46 is aligned with an emitter 36. A number of cavities 42 are then etched into the insulator layer 40 adjacent to the emitter 36, allowing the emitters 36 to have an unobstructed path through the extraction grid 44. After the baseplate 12 is finished, an organic material 52 is deposited over the extraction grid 44 and into the cavities 42. A thin plastic film 54 with an adhesive on one of its surfaces is attached to the top of the organic resist material 52, and a backing tape 55 is attached to the back side of the supporting substrate 32. Referring to FIG. 3, the backing tape 55 is generally stretched taut and attached to a ring 50, and then the tacky side of the tape 55 is pressed against the back side of the substrate 32.

In operation, the organic resist 52 and plastic film 54 form a barrier that protects the baseplate 12 from the particulate matter 24 produced by the abrasive wheel 20. After the wafer 10 is cut, the film 54 must be removed from the organic resist material 52, and the organic resist material 52 must be washed from the baseplate 12. Sometimes, however, the organic resist material 52 damages the baseplate 12 because a portion it may not be completely washed away after the wafer 10 is cut. Accordingly, the conventional process of protecting a baseplate 12 illustrated in FIGS. 2 and 3 is not only time-consuming and costly, but it may also damage the finished baseplates.

FIGS. 4 and 5 illustrate one embodiment of the method of the invention for cutting a wafer without producing any particulate matter or slag. Although the invention is generally described as applying to cutting FED baseplate assemblies from one another, it is equally applicable to cutting apart other types of microelectronic devices. A high energy beam 70 is aligned with a cutting line 18 on the wafer 10. The high energy beam 70 or the wafer 10 is moved so that the high energy beam 70 passes over the wafer 10 and penetrates the wafer 10 to an intermediate depth along the cutting line 18. The moving step is then repeated after each pass of the high energy beam 70 over the wafer 10 until the wafer is severed along the cutting line 18.

The high energy beam 70 is preferably a laser beam. In one embodiment, the high intensity beam is a YAG:Nd laser beam commonly available from Quantronix Corp., Spectra-Physics, Lambda Physik, Continuum, or Coherent Inc. The cutting rate of the wafer 10 is a function of several factors, some of which are: (1) the intensity of the high energy beam 70; (2) thickness of the wafer 10; (3) material from which the wafer 10 is made; (4) the susceptibility of the dies 12 to heat transfer; and (5) the angle of inclination of the high energy beam 70 with respect to the wafer 10. In the case of a 601 Laserscribe laser manufactured by Quantronix Corp., the cutting rate is estimated to be approximately 2 to 4 inches per second.

Figure 6A:
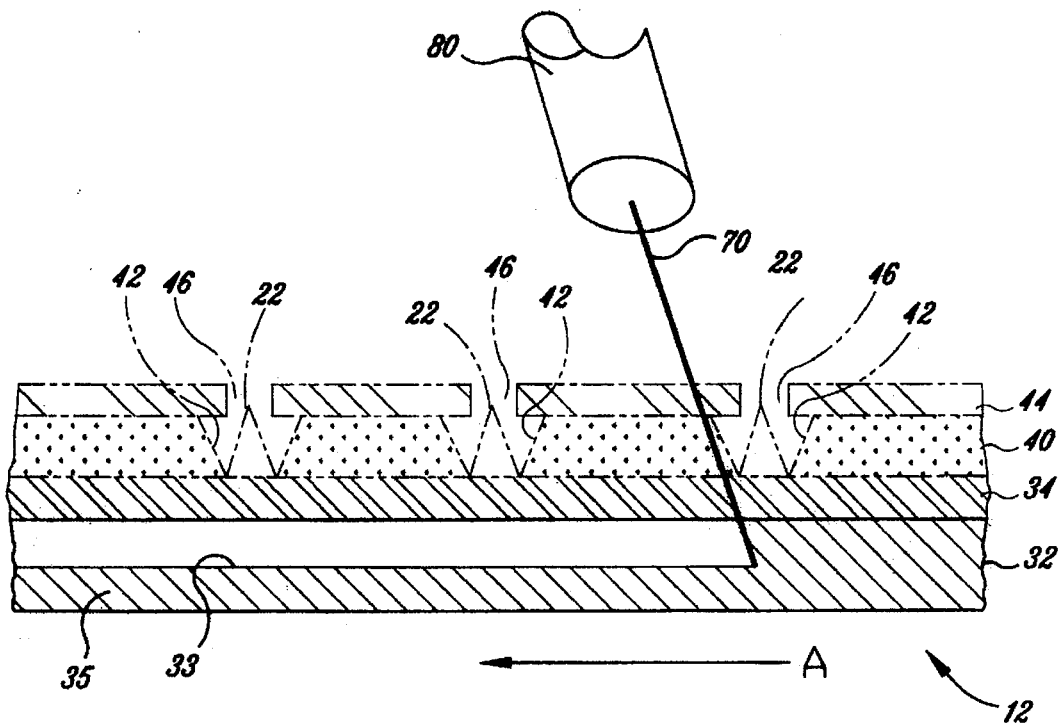
FIG. 6A is a cross-sectional view of an FED baseplate being cut in accordance with the invention.
Figure 6B:
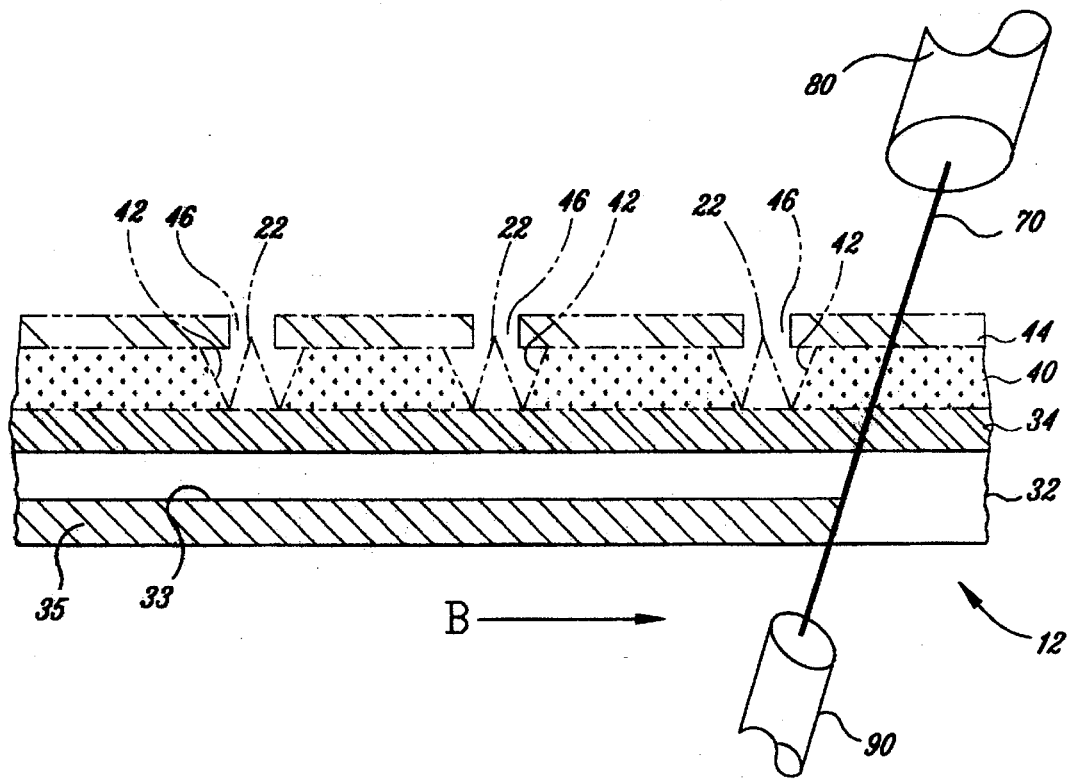
FIG. 6B is a cross-sectional view of the FED baseplate of FIG. 6A being cut in accordance with the invention.

FIGS. 6A and 6B more particularly illustrate the baseplate 12 being cut in accordance with the method of the invention. Referring to FIG. 6A, the high energy beam 70 impinges the substrate 32 and penetrates the substrate to an intermediate depth 33. The depth to which the high intensity beam 70 penetrates the substrate 32 is essentially controlled by either the intensity of the laser beam 70 or the relative velocity between the wafer 10 and the laser beam 70. The depth that the high intensity beam 70 penetrates the substrate 32 is inversely related to the relative velocity between the high intensity beam 70 and the substrate 32; a higher relative velocity between the high density beam 70 and the substrate 32 results in a lesser depth of penetration of the substrate. After the high intensity beam 70 makes one pass along the cutting line of the wafer, a lower portion 35 of the substrate 32 remains intact. Referring to FIG. 6B, the high intensity beam 70 is then moved along the same cutting line to penetrate through the lower portion 35 of the wafer 32, thus completing the cut through the substrate 32. A detector 90 may be positioned under the wafer to determine when the substrate 32 has been severed along the cutting line. In a preferred embodiment, the second pass across the lower portion 35 of the wafer 32 is accomplished by simply reciprocating the wafer 10 in the direction indicated by arrow B. In another embodiment, the second pass is accomplished by moving the wafer 10 back to its original starting position and moving it in the direction indicated by arrow A. The method of the invention is not limited to cutting the wafer 10 in two passes, but rather any number of multiple passes that incrementally cut through the wafer are within the scope of the invention.

The method of the invention depicted in FIGS. 6A and 6B is particularly useful for preventing slag from being produced on the perimeter of the baseplates. Slag is produced when the high energy beam heats the wafer above its melting point and melts a portion of the wafer. The temperature of the wafer is a function of several variables, two of which are the amount of time that the laser beam continuously impinges a single point before it is allowed to cool, and the intensity of the laser beam. When too much heat accumulates at a point on the wafer, the wafer begins to melt at that point. Compared to other laser cutting methods that completely penetrate the full depth of the wafer in a single pass, the present invention reduces the amount of heat that accumulates at any given point on the wafer by only incrementally penetrating the wafer with each pass of the high energy beam. After each pass of the high energy beam, some of the heat transferred to the wafer dissipates which reduces the amount of heat that accumulates in the wafer. Thus, by incrementally penetrating the material of the substrate 32 with multiple passes of the high energy beam 70, the temperature of the wafer may be controlled so that the wafer does not melt and create slag.

The present invention also provides other advantages over conventional wafer cutting techniques. One advantage is that the present invention does not produce any particulate matter that can ruin the baseplates. Unlike conventional abrasive wheels or laser scribes, the high intensity beam of the present invention incrementally burns through the wafer and vaporizes any matter that does not remain intact with the wafer. The present invention, therefore, does not require that a layer of organic resist or a plastic film be deposited on and then removed from the wafer during the cutting process. Accordingly, the present invention reduces the time and cost of producing baseplates.

Another advantage of the invention is that it eliminates the losses caused by depositing and removing the organic resist layer. As stated above, several baseplates on each wafer are commonly ruined when the organic resist is not completely removed from the wafer. Accordingly, by eliminating the need to deposit the organic resist on the baseplates, the present invention prevents the loss of baseplates due to problems originating from the organic resist layer.

The present invention also provides a method that reduces the number of cracks and the width of the kerf along the cut in a wafer. As discussed above, abrasive wheels create microcracks in a wafer. Laser cutting, however, does not create any cracks and thus reduces the number of cracks in a wafer. Laser cutting also produces a narrower kerf by approximately 5 µm, which provides more room to position dies on the wafer.

It will be appreciated that, although specific embodiments of the invention have been described herein for purposes of illustration, various modifications may be made without departing from the spirit and scope of the invention. Accordingly, the invention is not limited except as by the appended claims.

I claim:

1. In semiconductor manufacturing, a method for particulate-free cutting of a wafer to sever die assemblies from one another, comprising the steps of:

aligning a high energy beam with a cutting line on the wafer that defines a path between dies along which the wafer is to be cut;

moving at least one of the high energy beam or the wafer so that the high energy beam passes over the wafer along the cutting line and penetrates the wafer to an intermediate depth along the length of the cutting line; and repeating the moving step after each pass of the high energy beam over the wafer until the wafer is severed along the cutting line.

2. The method of claim 1 wherein the repeating step comprises reciprocating one of the high energy beam or the wafer so that the high energy beam passes over the wafer in a direction opposite to that of the immediately previous moving step.

3. The method of claim 1 wherein the repeating step comprises repositioning one of the high energy beam or the wafer so that the high energy beam passes over the wafer in a direction that is the same as that of the immediately previous moving step.

4. The method of claim 1 wherein the moving step comprises controlling the rate at which the one of the high energy beam or the wafer is moved so that the high energy beam does not penetrate to more than one-half of the thickness of the wafer.

5. The method of claim 1 wherein the high energy beam is a beam of laser light.

6. The method of claim 1, further comprising the step of providing a silicon wafer to be cut.

7. The method of claim 1, further comprising the step of detecting when the wafer has been severed.

\* \* \* \* \*